United States Patent
Abe et al.

[11] Patent Number: 5,422,894
[45] Date of Patent: Jun. 6, 1995

[54] REAL-TIME CONVOLUTIONAL DECODER WITH BLOCK SYNCHRONIZING FUNCTION

[75] Inventors: Masami Abe; Jun Iwata, both of Tokyo, Japan

[73] Assignee: Oki Electric Industry Co., Ltd., Tokyo, Japan

[21] Appl. No.: 267,593

[22] Filed: Jun. 21, 1994

[30] Foreign Application Priority Data

Jun. 25, 1993 [JP] Japan .................................. 5-154887

[51] Int. Cl.6 .......................................... H03M 13/12
[52] U.S. Cl. .................... 371/37.4; 371/42; 371/46
[58] Field of Search ............... 371/37.1, 37.4, 42, 371/46

[56] References Cited

U.S. PATENT DOCUMENTS

| | | |
|---|---|---|
| 4,312,070 | 1/1982 | Coombes et al. ............... 371/42 |
| 5,014,276 | 5/1991 | Bush et al. ................... 371/37.4 |
| 5,117,427 | 5/1992 | Miyake et al. ................. 371/37.4 |

Primary Examiner—Roy Envall
Assistant Examiner—Steven R. Garland
Attorney, Agent, or Firm—Spencer, Frank & Schneider

[57] ABSTRACT

A decoder receives frames of data that have been block coded, then convolutionally coded, at a rate of multiple frames per block. As each frame is received, the decoder counts it, stores convolutional code path information, and updates metric values pertaining to the paths. Once per block of frames, the decoder selects a path having the best metric value, convolutionally decodes one block, detects errors from both the block code and path metric, and generates error information. From the error information, the decoder decides whether block synchronization has been acquired or lost, and clears, decrements, or sets the frame count accordingly. If synchronized, the decoder outputs the block and its error information, and updates the path memory in preparation to decode the next block. Otherwise, the decoder prepares to reacquire block synchronization.

16 Claims, 8 Drawing Sheets

TIME (t) →

FIG. 4

| | | | | | | | | | | | |
|---|---|---|---|---|---|---|---|---|---|---|---|
| word00 | a00 | k01" | j02" | i03" | h04" | g05" | f06" | e07" | d08" | c09" | b10" | a11" |
| word01 | b00 | a01 | k02" | j03" | i04" | h05" | g06" | f07" | e08" | d09" | c10" | b11" |
| word02 | c00 | b01 | a02 | k03" | j04" | i05" | h06" | g07" | f08" | e09" | d10" | c11" |
| word03 | d00 | c01 | b02 | a03 | k04" | j05" | i06" | h07" | g08" | f09" | e10" | d11" |
| word04 | e00 | d01 | c02 | b03 | a04 | k05" | j06" | i07" | h08" | g09" | f10" | e11" |
| word05 | f00 | e01 | d02 | c03 | b04 | a05 | k06" | j07" | i08" | h09" | g10" | f11" |
| word06 | g00 | f01 | e02 | d03 | c04 | b05 | a06 | k07" | j08" | i09" | h10" | g11" |
| word07 | h00 | g01 | f02 | e03 | d04 | c05 | b06 | a07 | k08" | j09" | i10" | h11" |
| word08 | i00 | h01 | g02 | f03 | e04 | d05 | c06 | b07 | a08 | k09" | j10" | i11" |
| word09 | j00 | i01 | h02 | g03 | f04 | e05 | d06 | c07 | b08 | a09 | k10" | j11" |
| word10 | k00 | j01 | i02 | h03 | g04 | f05 | e06 | d07 | c08 | b09 | a10 | k11" |
| word11 | xxx | k01 | j02 | i03 | h04 | g05 | f06 | e07 | d08 | c09 | b10 | a11 |
| word12 | xxx | xxx | k02 | j03 | i04 | h05 | g06 | f07 | e08 | d09 | c10 | b11 |
| word13 | xxx | xxx | xxx | k03 | j04 | i05 | h06 | g07 | f08 | e09 | d10 | c11 |
| word14 | xxx | xxx | xxx | xxx | k04 | j05 | i06 | h07 | g08 | f09 | e10 | d11 |
| word15 | xxx | xxx | xxx | xxx | xxx | k05 | j06 | i07 | h08 | g09 | f10 | e11 |
| word16 | xxx | xxx | xxx | xxx | xxx | xxx | k06 | j07 | i08 | h09 | g10 | f11 |
| word17 | xxx | xxx | xxx | xxx | xxx | xxx | xxx | k07 | j08 | i09 | h10 | g11 |
| word18 | xxx | xxx | xxx | xxx | xxx | xxx | xxx | xxx | k08 | j09 | i10 | h11 |
| word19 | xxx | xxx | xxx | xxx | xxx | xxx | xxx | xxx | xxx | k09 | j10 | i11 |
| word20 | xxx | xxx | xxx | xxx | xxx | xxx | xxx | xxx | xxx | xxx | k10 | j11 |
| word21 | xxx | xxx | xxx | xxx | xxx | xxx | xxx | xxx | xxx | xxx | xxx | k11 |

REAL-TIME CONVOLUTIONAL DECODER WITH BLOCK SYNCHRONIZING FUNCTION

BACKGROUND OF THE INVENTION

The present invention relates to a Viterbi decoder for a convolutional code that is concatenated with a block code and transmitted in frames at a rate of two or more frames per block.

In a block code, the data to be transmitted are divided into blocks of a fixed size. A redundant code is generated from the data in each block and added to the block for the purpose of error detection or correction.

A convolutional code does not divide data into blocks, but generates output data at a rate N times higher than the input data rate, each group of N output bits being generated from the most recent K input bits. (K and N are positive integers.) Convolutional codes are commonly decoded by a maximum-likelihood algorithm known as the Viterbi algorithm.

It has been found that a low error rate can be attained by first performing a block coding process, then carrying out a convolutional coding process on the block-encoded data. Such concatenated codes have successfully returned data from the outer reaches of the solar system. They are also used in terrestrial communications: for example, in digital cellular telephony.

A natural way to decode such a concatenated code is to wait for an entire block of data to be received, then apply the Viterbi decoding algorithm and block decoding process to that block. A better method is to wait, before decoding one block, until part of the next block has been received, so as to give the Viterbi algorithm more data to work with and enable it to decode the convolutional code more accurately. A problem with both of these methods, however, is that the Viterbi algorithm requires many computational steps, so if all the computations for decoding one block must be performed in one burst, It is difficult for the decoder to operate in real time.

A further problem arises when the data are transmitted in frames and each block occupies multiple frames, with no indication of the frame in which a block begins. In this case the decoder has the additional tasks of acquiring block synchronization, detecting loss of block synchronization, and reacquiring block synchronization when lost.

Block synchronization is basically acquired by looking for agreement of the block code; that is, by checking whether the redundant code in each block has the right value. Here, however, a further problem arises: the block code may agree fortuitously, even when block synchronization has been lost.

SUMMARY OF THE INVENTION

It is accordingly an object of the present invention to decode, in real time, a convolutional code that is concatenated with a block code.

Another object of the invention is to detect loss of block synchronization despite accidental agreement of the block code.

Yet another object is to reacquire block synchronization when lost.

The invented decoder stores received frames of data temporarily in an input buffer memory. As each frame is received, the decoder stores path information describing possible convolutional code paths of the data in a path memory, and stores metric values pertaining to these paths in a metric memory. The decoder also keeps a count of frames received.

When this count reaches a value representing one block of frames, the decoder selects a path having the best metric value, and generates one block of convolutionally decoded data by retracing that path. Then the decoder detects errors according to the redundant code contained in the convolutionally decoded block and the metric value of the selected path, and generates corresponding error information.

From this error information, if the decoder has not already acquired block synchronization, it decides whether block synchronization has now been acquired. If block synchronization has now been acquired, the decoder clears the count to a value representing zero frames. If block synchronization has still not been acquired, the decoder alters the count to a value representing one frame less than one block of frames.

If block synchronization has already been acquired, the decoder outputs the decoded block and its error information, and decides from the error information whether block synchronization has now been lost. If block synchronization has not been lost, the decoder clears the count to a value representing zero frames. If block synchronization has been lost, the decoder sets the count to a value representing at most zero frames and prepares to acquire block synchronization again.

BRIEF DESCRIPTION OF THE DRAWINGS

FIG. 4 illustrates frame interleaving.

DETAILED DESCRIPTION OF THE INVENTION

An embodiment of the invention will be described with reference to the attached, purely illustrative drawings. First, however, a description of the coding process will be given, with reference to a particular case that poses the problems to which the invention is addressed. This is the case of the slow associated control channel (SACCH) of IS54, a North American interim standard for digital cellular telephony. Applications of the invention are of course not restricted to this case.

Figure 1:
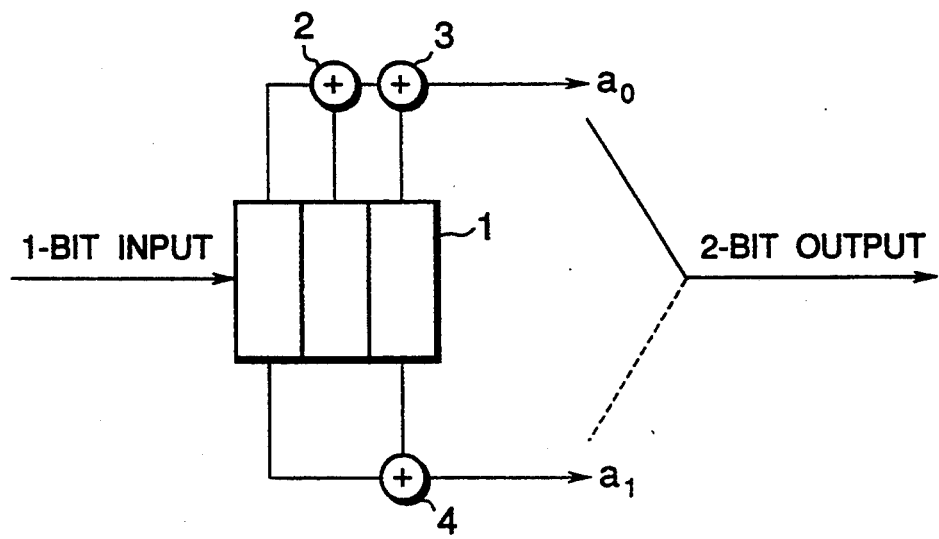
FIG. 1 is a block diagram of a convolutional coder.

FIG. 1 illustrates the general concept of convolutional coding. Input data are input one bit at a time to a shift register 1 having a length K of, for example, three bits. K is referred to as the constraint length of the convolutional code. The three bits in shift register 1 are combined by exclusive-OR gates 2 and 3 to generate a first output bit $a_0$, and the first and third bits are combined by an exclusive-OR gate 4 to generate a second output bit $a_1$. The two bits $a_0$ and $a_1$ are stored in a buffer (not shown), then output in serial form. Since there are two output bits for each input bit, the code is said to have a rate of ½. If the input data are regarded as coefficients $s_t$ in a sequence of the form $\{s_t x^t: t=0, 1, 2, \ldots\}$, the above operations can be regarded as convolving the sequence with two generator polynomials, $x^2+x+1$ and $x^2+1$, using modulo-two arithmetic.

Figure 2:
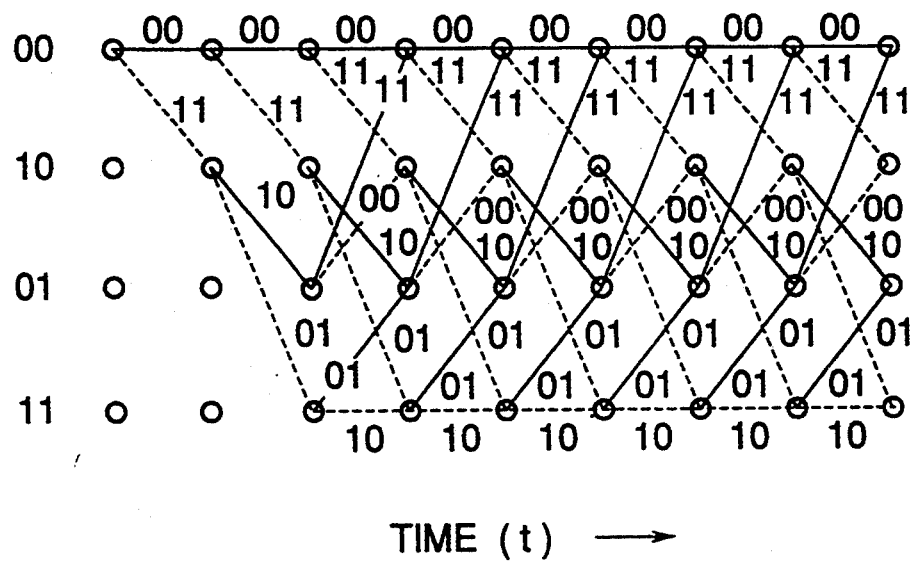
FIG. 2 is a trellis diagram of a convolutional code.

FIG. 2 shows a trellis-diagram description of this convolutional code. The coder is regarded as having $2^{K-1}$ states, each state being one possible combination of values of the most recent $K-1$ input bits (the first $K-1$ bits in the shift register 1). Each state corresponds to one row in the trellis: the top row, for example, corresponds to the "00" state. Arrival of a new input bit causes a transition from one state to another. In FIG. 2, solid line segments indicate transitions caused by input of a zero bit, and dotted line segments indicate transitions caused by input of a one bit. Each transition is accompanied by the output of two bits with the value indicated beside the line segment. Each line segment is referred to as a "branch."

The SACCH code is slightly more complex than the above, having the same rate of ½ but a constraint length of six instead of three. The SACCH trellis diagram accordingly has thirty-two states ($2^{6-1}$).

Figure 3:
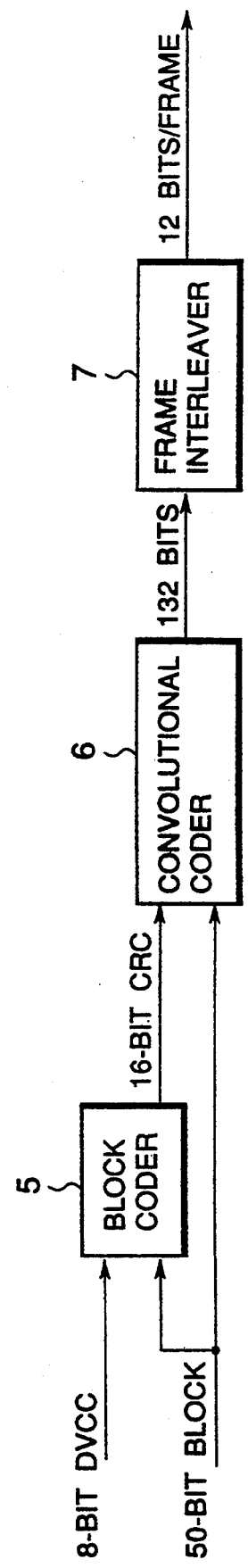
FIG. 3 is a block diagram of a transmitter.

FIG. 3 shows the structure of a SACCH transmitter, comprising a block coder 5 cascaded with a convolutional coder 6 and frame interleaver 7. The data to be encoded are divided for input into fifty-bit blocks, each block comprising forty-eight message bits, a one-bit continuation flag indicating whether the message bits are the start of a new message or the continuation of the previous message, and one spare bit.

These fifty bits are supplied to both the block coder 5 and convolutional coder 6. The block coder 5 also receives a so-called digital verification color code (DVCC) comprising eight bits. From the fifty-bit data block and eight-bit DVCC, the block coder 5 generates a sixteen-bit redundant code called a cyclic redundancy check code (CRC), which it supplies to the convolutional coder 6. The CRC computation can be described algebraically in terms of dividing a polynomial of the form $d_{57}x^{57}+\ldots+d_1x+d_0$, the fifty-eight coefficients of which represent the block data and DVCC, by a generator polynomial of the form $x^{16}+\ldots+g_1x+g_0$. The sixteen coefficients of the remainder polynomial become the CRC code.

The convolutional coder 6 thus receives sixty-six bits per block. From these bits, by a process like that described in FIG. 1 or 2, it generates one hundred thirty-two convolutionally encoded bits. In order of output, these bits will be denoted $a_{00}, a_{01}, \ldots, a_{10}, a_{11}, b_{00}, b_{01} \ldots, b_{10}, b_{11} \ldots, j_{00}, j_{01} \ldots, j_{10}, j_{11}, k_{00}, k_{01} \ldots, k_{10}, k_{11}$. The convolutional coding process is not broken at block boundaries; that is, the shift register 1 in FIG. 1 is not cleared between blocks.

The output of the convolutional coder 6 is supplied to the frame interleaver 7, which interleaves the bits into a series of twelve-bit words denoted $word_{00}, word_{01} \ldots$ Referring to FIG. 4, $a_{00}$ becomes the first bit of $word_{00}$, $a_{01}$ the second bit of $word_{01}$, $a_{11}$ the last bit of $word_{11}$, $b_{00}$ the first bit of $word_{01}$, $b_{01}$ the second bit of $word_{02}$, and $k_{11}$ the last bit of $word_{21}$. Double apostrophes (") in FIG. 4 denote bits generated from the previous block. X's denote bit positions that will be filled with encoded bits from the next block. The frame interleaver 7 outputs the words in their numbered order, $word_{00}$ first, then $word_{01}$ and so on.

Figure 5:
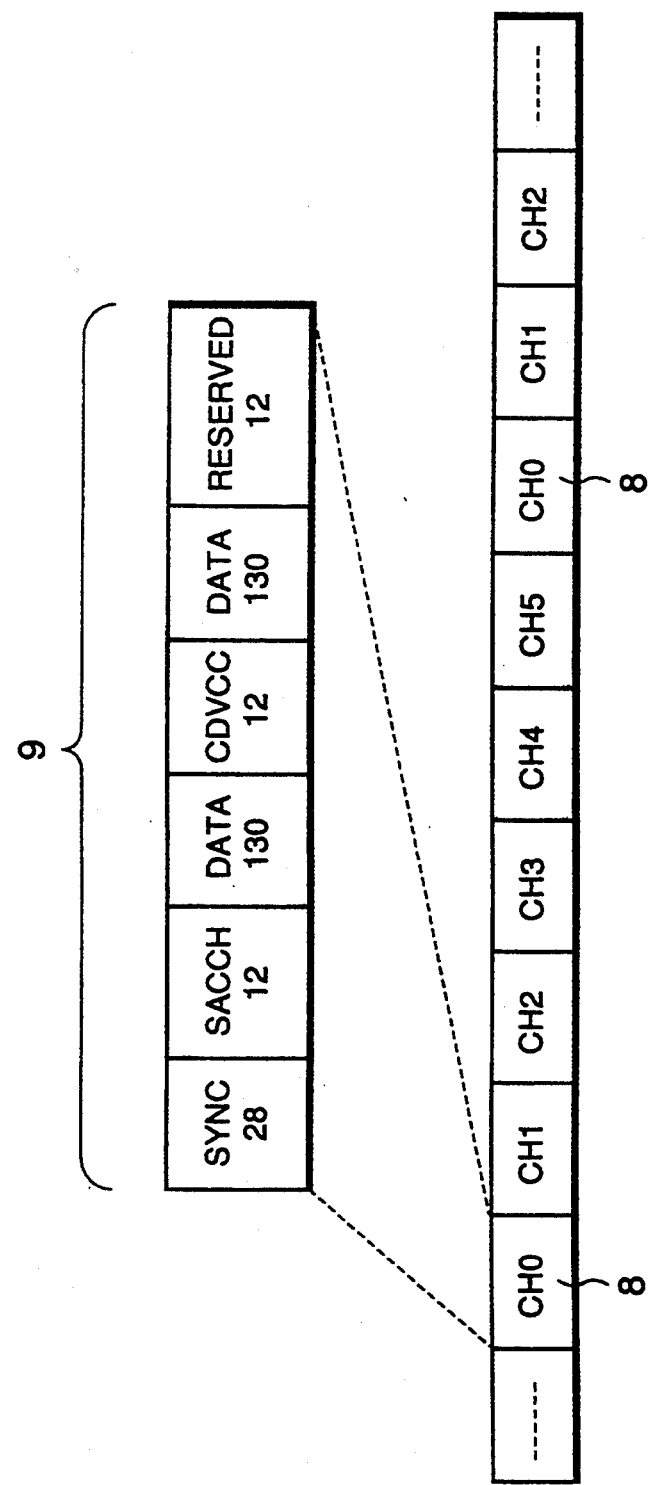
FIG. 5 illustrates a time-division multiple-access frame structure.

The interleaved words are transmitted in separate frames by a time-division multiple-access (TDMA) scheme shown in FIG. 5. Time slots 8 are rotated among six channels (CH0 to CH5). In a given channel, one frame 9 comprises a synchronization pattern (SYNC), followed by one of the SACCH words in FIG. 4, then a data field, a coded digital verification color code (CDVCC), another data field, and a reserved field. The bit length of each field is indicated in FIG. 5 below the field name.

Henceforth, "frame" will sometimes be used to refer to the twelve-bit SACCH field in FIG. 5, disregarding the other fields, which are not directly related to the present description. That is, the terms "frame" and "word" will both be used to denote that part of the interleaved block data which is transmitted and received in one frame.

Since the encoded SACCH data comprise one hundred thirty-two bits per block and are transmitted at a rate of twelve bits per frame, the block rate is one block every eleven frames ($11 \times 12 = 132$). Eleven consecutive frames will accordingly be referred to as a block of frames, even though each block of SACCH data actually extends over parts of twenty-two frames (e.g. the frames containing $word_{00}$ to $word_{21}$ in FIG. 4). For example, $word_{00}$ to $word_{10}$ in FIG. 4 constitutes one block of frames, as indicated by the horizontal line.

At the receiving end, a time-division demultiplexer detects the synchronization patterns, extracts the various fields shown in FIG. 5, and supplies them to the appropriate decoders. One of these decoders is a SACCH decoder. The SACCH decoder thus receives well-defined twelve-bit words, but is not told the position of these words in the block interleaving scheme of FIG. 4. That is, although the demultiplexer carries out frame synchronization, block synchronization is the responsibility of the SACCH decoder.

Figure 6:
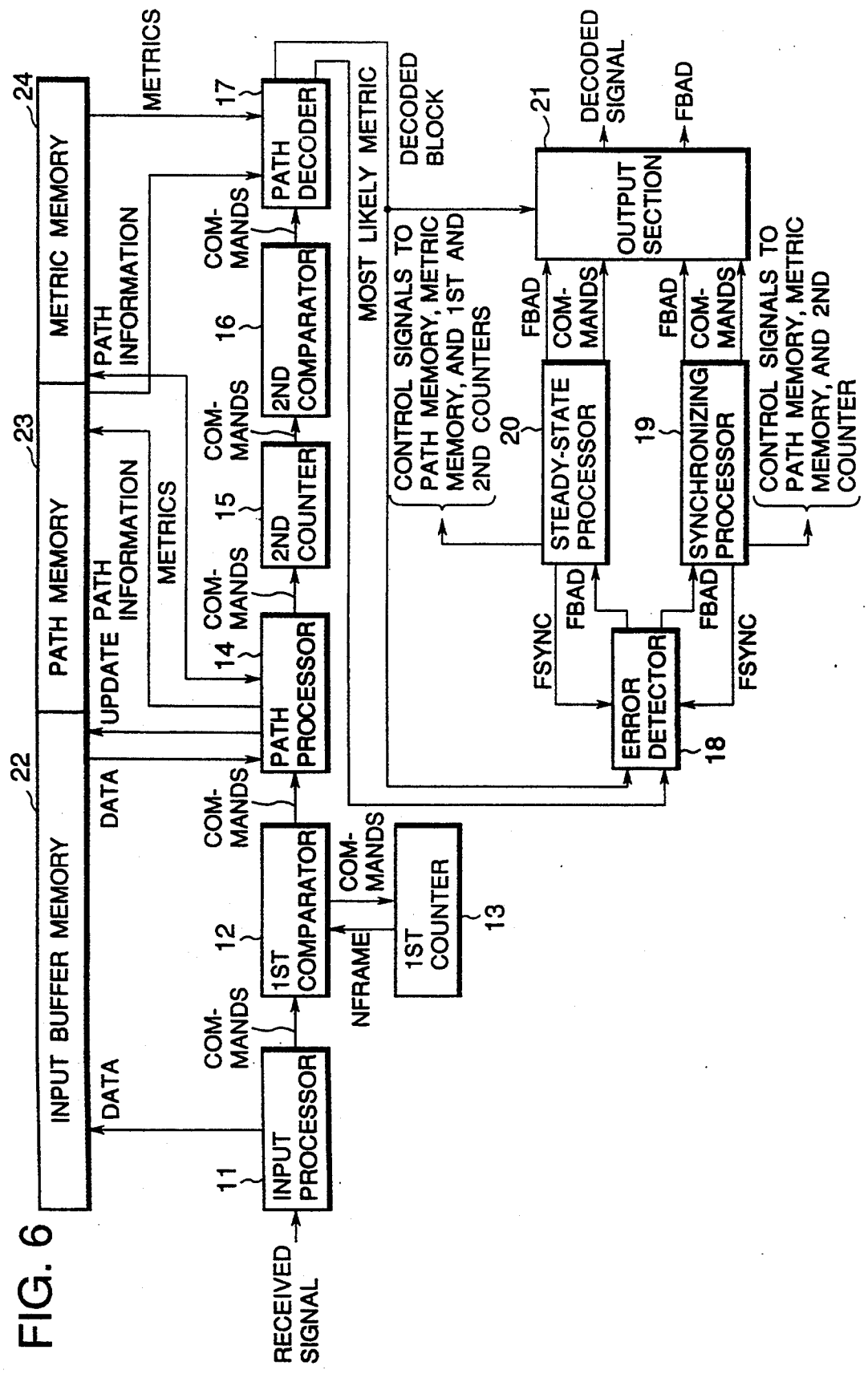
FIG. 6 is a block diagram of the Invented decoder.

FIG. 6 shows a novel type of decoder that can be used to decode the SACCH data described above, or other similarly encoded data. The decoder comprises an input processor 11, a first comparator 12, an first counter 13, a path processor 14, a second counter 15, a second comparator 16, a path decoder 17, an error detector 18, a synchronizing processor 19, a steady-state processor 20, an output section 21, an input buffer memory 22, a path memory 23, and a metric memory 24. One feature of the invention is that the Viterbi algorithm processing is divided between two processors: the path processor 14 and path decoder 17.

Also indicated in FIG. 6 are various flag and count symbols. Table 1 summarizes the meanings of these symbols and of other notation that has been or will be introduced.

TABLE 1

| | Notation |
|---|---|
| FBAD | Error flag |
| FSYNC | Block synchronization flag |
| K | Constraint length of convolutional code |
| ND | Delay length; multiple of NU below, corresponding to number of additional frames received before final decoding of block |
| NT | Block size in terms of bits before convolutional coding; received block size x coding rate |
| NU | Word size in terms of bits before convolutional coding; received word size x coding rate |
| NFRAME | Count maintained by first counter 13, indicating number of frames for which data is stored in |

TABLE 1-continued

| | Notation |
|---|---|
| | input buffer memory 22 |
| NSYNCER | Count maintained by steady-state processor 20, indicating number of consecutive blocks in which errors have been detected |
| NVTB | Frame count maintained by second counter 15, indicating number of frames for which new path information has been generated |

The flag values FSYNC and FBAD are shown in FIG. 6 as being passed from one processing section to another. This arrangement is useful if the processors operate in parallel, but it is also possible to place the flag values in a common memory area (not illustrated) where they can be accessed by all processors as needed.

K, ND, NT, and NU are constants. In SACCH data, K is six bits, the received word size is twelve bits, and the received block size is one hundred thirty-two bits. Since the coding rate is ½, NT is sixty-six bits and NU is six bits.

ND may be any multiple of NU, including zero. Larger values of ND lead to more accurate decoding, but experience has shown that a delay equal to, for example, about five times the constraint length K is adequate.

The capacity of the Input buffer memory 22 should be sufficient to enable the path processor 14 to de-interleave the incoming data. For a SACCH decoder, the required capacity is twelve frames (one hundred forty-four bits). The input buffer memory 22 is conveniently structured as a ring buffer. Referring again to FIG. 4, after twelve frames have been received, the input buffer memory 22 contains the bit data of $word_{00}$ to $word_{11}$. When the next frame, containing $word_{12}$, is received, $word_{12}$ is overwritten on $word_{00}$, as indicated by the arrow in FIG. 4, so that the memory now contains $word_{01}$ to $word_{12}$. Succeeding words are similarly overwritten. When $word_{21}$ is received, it is overwritten on $word_{09}$, at which point the input buffer memory 22 contains the bit data of $word_{10}$ to $word_{21}$.

The path memory 23 is structured as a two-dimensional array with dimensions of $2^{K-1}$ and (NT+ND). The elements of this array correspond to the $2^{K-1}$ possible states of the convolutional coder 6 in FIG. 3, during (NT+ND) bits of input to the coder 6. An element P(m, t) of this array is a pointer from a certain state (m) at a certain time (t) to another state at the previous time (t−1). The path memory 23 requires sufficient size to store $2^{K-1}$ x (NT+ND) pointers. The pointers define $2^{K-1}$ paths that trace backward through the array, following lines of the trellis diagram in FIG. 2. The path memory 23 can be conveniently managed as a ring buffer with respect to the parameter t.

The metric memory 24 is structured as a one-dimensional array of metric values, containing one metric value for each of the $2^{K-1}$ paths defined in the path memory 23. Two path metrics are commonly used in convolutional decoding: Hamming distance (total number of received bit discrepancies); and correlation value (inner product). Although the invention is not restricted to any particular path metric, Hamming distance will be assumed In this embodiment. The metric memory 24 should accordingly have sufficient capacity to store $2^{K-1}$ integer values.

In addition, the decoder requires a certain amount of work memory for temporary storage of, for example, flag values, count values, and branch metric values. The work memory is omitted from the drawings.

The memory requirements outlined above are modest, and the entire decoder in FIG. 6 is well within a scale that can be implemented in a specially-designed monolithic semiconductor integrated circuit. Alternatively, the decoder can be constructed from standard commercial integrated circuits. Specific hardware descriptions will be omitted to avoid obscuring the invention with needless detail.

The operation of the invented decoder will now be described with reference to the flowchart in FIG. 7.

Before any data are received, the metric memory 24 is cleared to all zeros, the count and flag values NFRAME, FSYNC, and NSYNCER are initialized to zero, and the count value NVTB is Initialized to −ND/NU (step S30). The purpose of the negative value of NVTB is to provide a delay of ND/NU frames between the reception of data for a block and the convolutional decoding of that block.

After this initialization, as each frame is received, the twelve bits of SACCH data it contains are stored in the input buffer memory 22 by the input processor 11 (step S31). At the end of this step, the input processor 11 passes control to the first comparator 12.

The first comparator 12 compares NFRAME with a first constant value, indicating the number of frames that must have been received before the path processor 14 can begin generating path pointers (step S32). With the interleaving scheme shown in FIG. 4, this first constant value is twelve.

If NFRAME has not reached the first constant value, the first comparator 12 commands the first counter 13 to increment NFRAME by one (step S33). This completes the processing of the frame. The decoder now waits for the next frame (step S70), then returns to step S31.

When NFRAME reaches the first constant value (twelve), causing a result of "equal" to be obtained in step S32, the first comparator 12 commands the path processor 14 to generate new path pointers.

First, the path processor 14 de-interleaves twelve bits of data by reading the first bit of the first word currently stored in the input buffer memory 22, the second bit of the second word, and so on, obtaining, for example, bits $a_{00}, a_{01}, \ldots, a_{11}$, in FIG. 4 (step S34).

Next the oldest word is cleared from the input buffer memory 22 to make room for the next word (step S35). If the input buffer memory 22 is managed as a ring buffer, this update can be performed simply by shifting a buffer pointer, without actually altering any of the data in the buffer.

Next, the path processor 14 calculates branch metric values (step S36), stores new pointers in the path memory 23 (step S37), and updates the metric memory 24 (step S38). These steps will bc described in detail later.

After executing these steps for the twelve bits read from the input buffer memory 22, the path processor 14 commands the second counter 15 to increment NVTB by one (step S39).

Next, the second counter 15 commands the second comparator 16 to compare NVTB with a second constant value (step S40) equal to the number of frames per block. In a SACCH decoder, this second constant value is eleven. If NVTB is less than eleven, the decoder waits for the next frame (step S70), then returns to step S31.

When NVTB reaches eleven, the value representing one block of frames, the second comparator 16 commands the path decoder 17 to convolutionally decode one block. The path decoder does this by selecting a most likely metric value in the metric memory 24 (step S41), selecting a corresponding path in the path memory 23, then tracing pointers back along that path to obtain NT decoded bits (step S42). These steps will be described in more detail later. The NT decoded bits correspond to a block of data that was input to the convolutional coder 6 in FIG. 3, comprising fifty data bits and a sixteen-bit CRC code.

The path decoder 17 supplies the most likely metric value found in step S41 and the convolutionally decoded block obtained in step S42 to the error detector 18. The convolutionally decoded block is also supplied to the output section 21.

The error detector 18 takes, for example, the first fifty bits of the decoded block, combines them with the digital verification color code, which has been obtained by another decoder from the CDVCC in FIG. 5, and carries out the same computation as performed by the block coder 5 in FIG. 3 to generate a sixteen-bit CRC code (step S44). Then it compares this regenerated CRC code with the CRC code that was received as part of the block to see if the received CRC code has the correct value (step S45).

The error detector 18 also compares the most likely metric value received from the path decoder 17 with a third constant value (step S45). This third constant value is, for example, the metric value that would occur if the SACCH data were received without any transmission errors. For the Hamming-distance metric, this value is zero.

On the basis of the comparisons in steps S44 and S45, the error detector 18 detects errors (step S46) and sets or clears the error flag FBAD. In the present embodiment, if the received CRC code has the correct value and the most likely metric value matches the third constant, the error detector 18 clears FBAD to zero (step S47), indicating that the current block was received in synchronization and without error. If the received CRC code has the wrong value, or the most likely metric value does not match the third constant, the error detector 18 sets FBAD to one (step S48), indicating that the current block is out of synchronization, or was received with an error.

Next the block synchronization flag FSYNC is tested (step S49). If FSYNC is zero, indicating that block synchronization has not yet been acquired, control passes to the synchronizing processor 19. If FSYNC is one, indicating that block synchronization has been acquired, control passes to the steady-state processor 20. The initial value of FSYNC is zero, so the first time step S49 is carried out, control passes to the synchronizing processor 19.

When the synchronizing processor 19 receives control, it begins by testing the error flag FBAD (step S50).

If FBAD is one, the synchronizing processor 19 decides that block synchronization has still not been acquired, and takes steps to continue looking for synchronization. First, it updates the path memory 23 by discarding the pointers for the oldest frame stored therein, to make room for the pointers of the next frame (step S51). This update process will be described in more detail later.

Next, the synchronizing processor 19 updates the metric memory 24 by subtracting a certain quantity from each of the stored metric values (step S52). The purpose of this step is to prevent the metric values from overflowing. The quantity subtracted can be, for example, a fixed quantity, or a quantity related to the maximum metric value currently stored. Then the synchronizing processor 19 decrements NVTB by one (step S53). The value of NVTB is eleven, so it is decremented to ten.

After step S53, the decoder waits for the next frame (step S70), then returns to step S31. When the next frame is processed, since the NVTB count value has been decremented from eleven to ten, in step S39 it will be incremented back to eleven, and the same steps from step S40 to step S50 will be carried out again. These steps will decode and test a block that overlaps the previous block, being shifted by one frame in relation to the previous block. If FBAD is again set to one, steps S51 to S53 will also be executed again. This entire process will continue to loop until FBAD is cleared to zero in step S47.

When FBAD is cleared to zero, the decoder learns in step S50 that the most likely metric value matched the third constant value, implying that the block was received without error, and that the CRC code had the correct value, implying that the decoder has achieved block synchronization. Accordingly, the decoder sets the block synchronization flag FSYNC to one (step S54) and passes control to the steady-state processor 20.

The steady-state processor 20 begins by commanding the output section 21 to output the decoded block (step S55) and error flag FBAD (step S56). If the CRC code is not required in subsequent processing, the output section 21 need output only the fifty data bits of the block, discarding the sixteen CRC bits.

Next, the steady-state processor 20 updates the path memory 23 by discarding the pointers for the block that has just been output, to make room for the pointers of the next block (step S57). This update process will be described in more detail later. Then the steady-state processor 20 clears the metric memory 24 to all zeros (step S58), thereby clearing all existing metric values from the metric memory 24, and clears NVTB to zero (step S59).

This completes the processing of one block. The decoder now waits for the next frame (step S70), then returns to step S31.

After this, the decoder will continue to cycle through steps S31 to S40, incrementing NVTB each time, until eleven more frames have been received. At this point the decoder is ready to decode the next block. Since NVTB has reached the second constant value of eleven again, steps S41 to S49 will be carried out to decode that block and detect errors. Since the value of FSYNC is one, in step S49 control will be passed to the steady-state processor 20.

The steady-state processor 20 now begins by testing the error flag FBAD (step S60). If FBAD is zero, indicating absence of errors, the steady-state processor 20 clears the NSYNCER count value to zero (step S61). Then it carries out steps S55 to S58 as already described, to output the decoded block and its error flag and update the path and metric memories in preparation for the next block. After this, NVTB is cleared to zero again (step S59) and the same process is repeated as above.

If FBAD is set to one, indicating presence of an error, the steady-state processor 20 increments NSYNCER by one (step S63), then compares NSYNCER with a fourth constant value (step S64). This fourth constant value should be greater than the number of frames in which consecutive errors might occur due to transmission-path problems such as multi-path fading.

If NSYNCER is less than the fourth constant value, the steady-state processor 20 again carries out steps S55 to S59. The error flag value output in step S56 (FBAD=1) indicates that the block data output in step S55 may be corrupted by errors. Appropriate action can then be taken by the processor (not shown) that receives the output data, e.g. using the CRC code to attempt to correct the errors, or requesting the transmitter to retransmit the block.

If NSYNCER is equal to the fourth constant value, indicating that errors have persisted for a longer time than might be attributable to problems such as fading, the steady-state processor 20 decides that block synchronization has been lost and clears the block synchronization flag FSYNC to zero (step S65). Then it re-initializes the counters, clearing NSYNCER to zero (step S66), clearing NFRAME to zero (step S67), and setting NVTB to −ND/NU (step 68). Finally, It clears the metric memory 24 to all zeros (step S69).

The decoder now waits for the next frame (step S70), then returns to step S31 and proceeds to reacquire block synchronization by the process already described.

The advantage of the above-described method of detecting loss of block synchronization becomes apparent when frame synchronization is temporarily lost due, for example, to severe fading. Until frame synchronization is regained, the decoder receives scrambled data, quite possibly data not originally transmitted in the SACCH time slot. Such random data cannot be convolutionally decoded, and the path metrics will be consistently bad. During the random data interval, however, the CRC code might, purely by coincidence, have the correct value in one or more consecutive blocks. If the decoder were detecting only CRC errors, such random CRC agreement might fool the decoder into thinking that block synchronization had been reacquired, causing it to reset NSYNCER to zero, thereby delaying the true reacquisition of block synchronization. The invented decoder, however, takes heed of the bad path metric value, realizes that block synchronization cannot have been reacquired yet, and avoids this needless delay.

The above has been an overall description of the configuration and operation of the invented decoder, mentioning some of its advantages. Next a more detailed description of the Viterbi decoding process and memory update processes will be given.

The Viterbi decoding process can be broken down into five steps as follows:

1. Calculate branch metrics
2. Add, compare, and select
3. Store path pointers and metrics
4. Select most likely metric value
5. Decode The first three of these steps are performed by the path processor 14 (steps S37, S38, and S39 in FIG. 7). The last two are performed by the path decoder 17 (steps S41 and S42).

Figure 8:
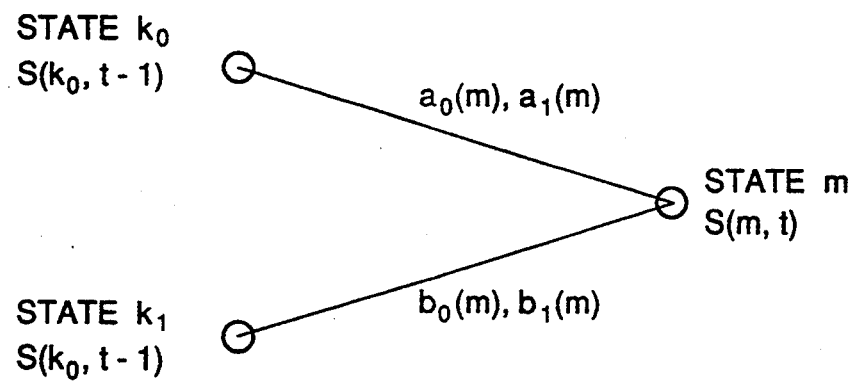
FIG. 8 illustrates two branches in a trellis diagram.

Referring again to the trellis diagram of FIG. 2, at any given time (t) there are two branches leading into each state. FIG. 8 shows an enlarged view of one state (m) and the two branches leading into it from two possible preceding states ($k_0$ and $k_1$). Associated with each of these branches is the pair of encoded bits that would be generated by the state transition represented by the branch. In FIG. 8, $a_0(m)$ and $a_1(m)$ are the bits associated with the top branch; $b_0(m)$ and $b_1(m)$ are the bits associated with the bottom branch. The parameter m takes on $2^{K-1}$ values, and $a_0(m)$, $a_1(m)$, $b_0(m)$, and $b_1(m)$ are each zero or one.

The path processor 14 processes the received data two bits at a time; that is, the value of t increases by one for every two received bits. If the two bits of encoded data received at time t are $r_0(t)$ and $r_1(t)$, the path processor 14 proceeds as follows.

First, for every state m, it calculates the metric values of the two branches leading into state m at time t and stores these two branch metrics in work memory. The calculations in this embodiment are:

Top branch mettle $sw_0(m) = S(k_0, t-1) + eor\{a_0(m), r_0(t)\} + eor\{a_1(m), r_1(t)\}$ Bottom branch metric $sw_1(m) = S(k_1, t‘1) + eor\{b_0(m), r_0(t)\} + eor\{b_1(m), r_1(t)\}$ $S(k_0, t-1)$ and $S(k_1, t-1)$ are the values currently stored in metric memory 24 for states $k_0$ and $k_1$, pertaining to paths up to time $t-1$. The symbol "eor" denotes the exclusive-OR operation, which returns a value of zero if the two quantities within the braces are equal and a value of one if they are unequal. In other words, the path processor 14 calculates the Hamming distance between each branch and the two bits actually received, and adds this distance to the Hamming distance of the associated path up to time $t-1$.

Incidentally, the number of different combinations of $k_0$ and $k_1$ is $2^{K-2}$. The path processor 14 can work in order of either the k's or the m's.

After calculating branch metrics for all states m and storing them in work memory, for each state m, the path processor 14 compares the two branch metric values $sw_0(m)$ and $sw_1(m)$, selects the branch with the more likely (i.e. smaller) metric, and stores a pointer in the path memory 23 representing the selected branch. If $P(m, t)$ is the pointer value for state m at time t, then:

$$\text{Path pointer } P(m, t) = k_0 \text{ of } sw_0(m) < sw_1(m)$$
$$= k_1 \text{ if } sw_1(m) < sw_0(m)$$

In addition, the selected metric value is stored in the metric memory 24, updating the old metric value $S(m, t-1)$ for state m to a new value $S(m, t)$.

Path metric value $S(m, t) = \min\{sw_0(m), sw_1(m)\}$

The metric memory 24 actually stores only a single metric value $S(m)$ for each state m. The notation $S(m, t)$ and $S(m, t-1)$ is being used above only for explanatory purposes, to indicate how $S(m)$ changes at different times.

As each twelve-bit frame is received, the path processor 14 performs this entire process six times, once for each pair of bits. Selecting one branch every time keeps the amount of path information pruned to one path for each state; this is a key feature of the Viterbi algorithm.

Next, the process performed by the path decoder 17 at every eleventh frame will be described.

First, the path decoder 17 reads all the path metric values $S(m)$ in the metric memory 24 and selects a state $m_0$ having a minimum metric value $S(m_0)$. Then it reads the most recently stored pointer $P(m_0, t)$ for this state, and retraces the pointer chain through (NT+ND) states in the following manner:

$m_1$: $P(m_0, t)$
$m_2 = P(m_1, t-1)$
$m_3 = P(m_2, t-2)$
Etc.

The state numbers $m_1, m_2 \ldots$ can be written in binary notation so that they represent values of $K-1$ bits in the shift register 1 of FIG. 1. To decode the block, the path decoder 17 simply takes, for example, the most significant of these $K-1$ bits for each of the oldest NT states on the pointer chain.

To decode a block, the path decoder 17 need only compare $2^{K-1}$ metric values (thirty-two values for a SACCH decoder), then trace NT+ND pointers, a process that can be performed very rapidly since it involves no arithmetic. The invented decoder can therefore operate easily in real time.

Next, updating of the path memory 23 will be described with reference to FIGS. 9 to 12.

Figure 9:
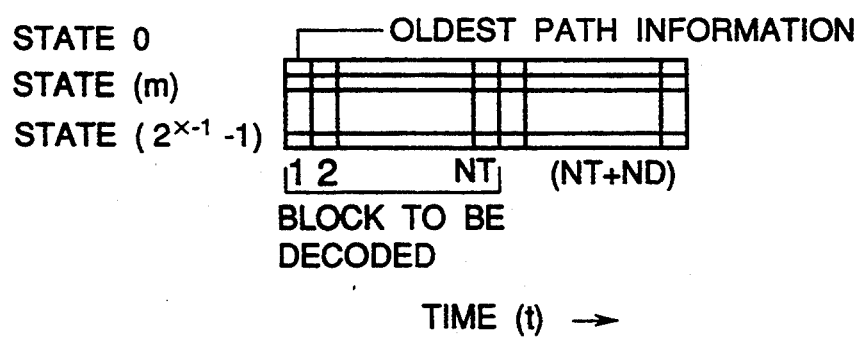
FIG. 9 illustrates the structure of the path memory in FIG. 6.

FIG. 9 shows the structure of the path memory 23 as a two-dimensional array, with states (m) from zero to $2^{K-1}-1$ indicated on the vertical axis and time (t) from one to (NT+ND) indicated on the horizontal axis. The pointers representing the block to be decoded are always located in the first NT positions (t=1 to NT).

Figure 10:
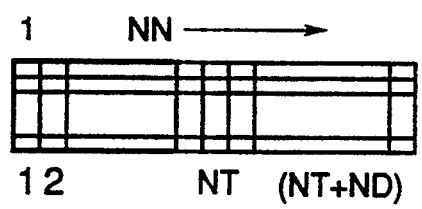
FIG. 10 illustrates the storage of path data in path memory.

FIG. 10 shows pointer information being stored in the path memory 23 starting from the initial state, either when reception first begins or after block synchronization has been lost. Storing of pointers proceeds from left to right in the drawing. NN represents the amount of pointer information that has been stored so far. Since the code rate is ½, the number of received bits is two times NN.

Figure 7:
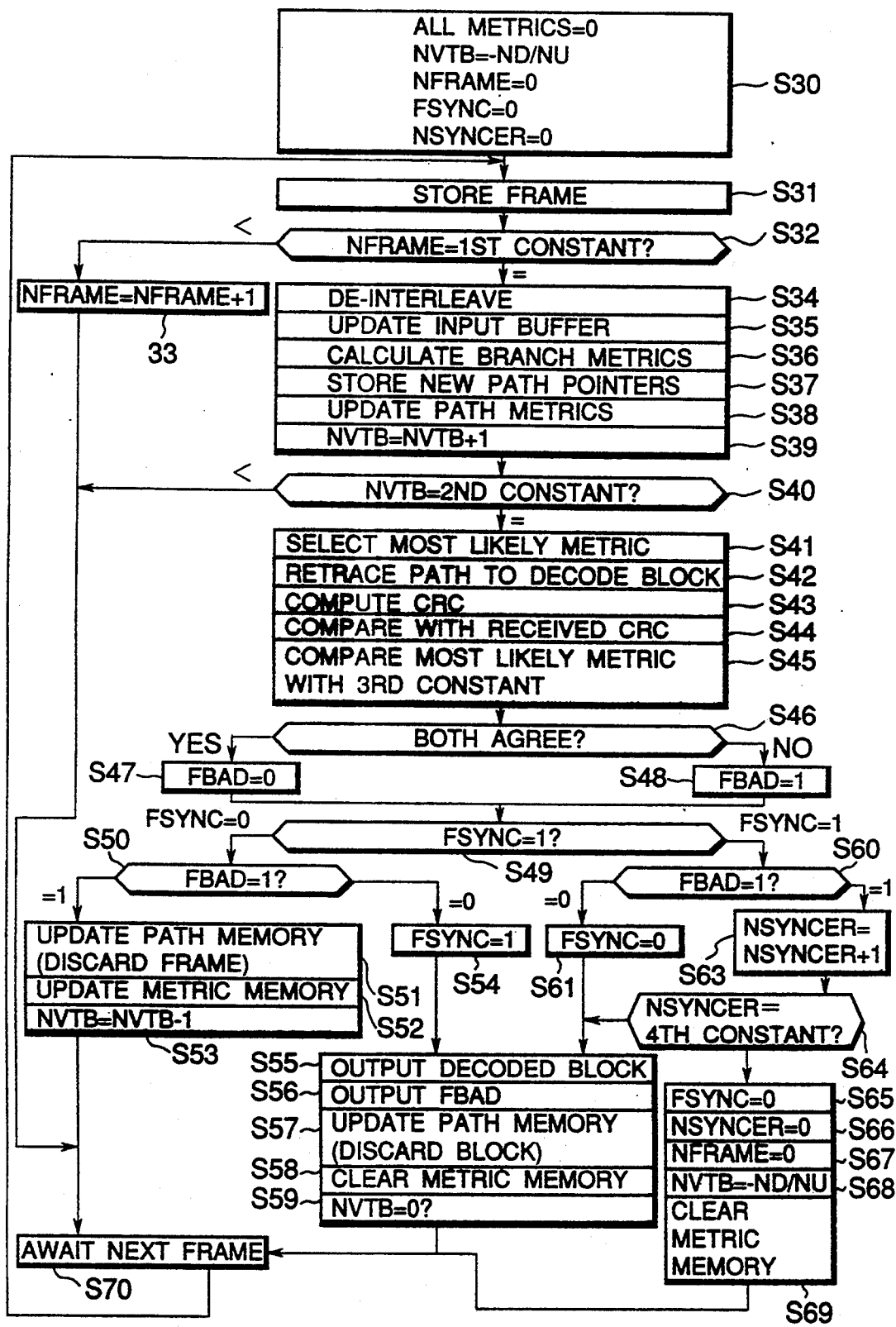
FIG. 7 is a flowchart illustrating the operation of the invented decoder.
Figure 11:
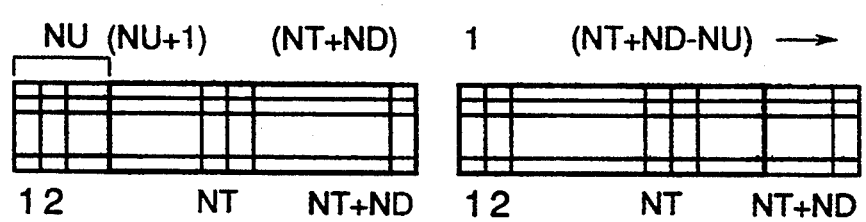
FIG. 11 illustrates the updating of path memory before block synchronization is acquired.

FIG. 11 shows the update at step S51 in FIG. 7, when one frame is discarded because block synchronization has not yet been acquired. In effect, the old pointers stored from positions one to NU are discarded, and the pointers stored from positions (NU+1) to (NT+ND) are shifted back into positions one to (NT+ND−NU). Pointers for the following received bits will accordingly be stored starting from position (NT+ND−NU+1).

Figure 12:
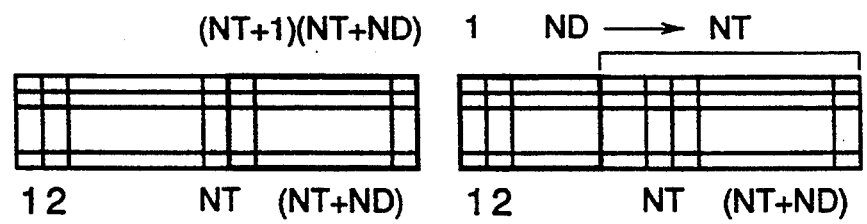
FIG. 12 illustrates the updating of path memory after block synchronization is acquired.

FIG. 12 shows the update at step S57 in FIG. 7, when one properly synchronized block has been decoded. Here the pointers for the decoded block, stored from positions one to NT, are discarded, and the pointers stored from positions (NT+1) to (NT+ND) are shifted back into positions one to ND. Pointers for the following received bits will be stored starting from position (ND+1).

If the path memory 23 is used as a ring buffer, the shifts in FIG. 11 and FIG. 12 can be accomplished without actually moving any data.

After block synchronization is acquired, since the metric memory is cleared in step S58, when the block stored in positions one to NT is decoded, it is decoded according to the path metrics for positions ND+1 to (NT+ND), ignoring the first ND positions. This greatly simplifies the decoding process at only a minor cost in decoding accuracy. If NT exceeds the constraint length K sufficiently (as in a SACCH decoder, where NT=11×K), there is a very high probability that all paths will be identical over their initial part up to position ND, rendering that part of the path metric irrelevant.

The scope of the Invention is not limited to the embodiment described above but allows many variations. For example, the path metrics need not be calculated by the equations given above. Other methods of calculation can be used.

Furthermore, the decoder need not be configured as shown in FIG. 6. The steps in FIG. 7 can be combined into hardware or software modules in various other ways. In the extreme case, all processing can be carried out by a single processor.

The decoder described above views any deviation between the selected path and the actual received data as an error, but it is possible to adopt a less strict view, taking into account the error-correcting capability of the convolutional decoder. For example, errors can be recognized when the path metric exceeds a certain positive value.

Similarly, if the block code permits a degree of error correction, the error detector 18 can be adapted to perform such correction and flag only uncorrectable errors.

Instead of deciding that block synchronization has been lost when errors occur a certain number of times consecutively, the steady-state processor 20 can be adapted to detect loss of synchronization in other ways: for example, when errors occur at a certain rate.

The invention is not restricted to a SACCH decoder. It is applicable to other coding schemes in which block coding and convolutional coding are concatenated and individual blocks are transmitted over multiple frames.

Nor is the invention restricted to any particular interleaving method, constraint length, coding rate, generator polynomials (for the convolutional code or block code), path metric, path memory structure, or method of storing path information.

It is not necessary for the convolutional code to be interleaved at all. If the data are not interleaved, the path processor 14 can process frames as soon as they are received, and the first comparator 12 and first counter 13 in FIG. 6 can be omitted.

Those skilled in the art will recognize that still further modifications of an obvious nature can be made without departing from the scope of the invention claimed below.

What is claimed is:

1. A method of decoding data that have been block encoded with a redundant code in each block, then convolutionally coded and transmitted in frames at a rate of at least two frames per block, comprising the steps of:

receiving said frames and storing their data temporarily in an input buffer memory;

storing path information describing possible convolutional code paths of said data in a path memory, new path information being stored as each of said frames is received;

storing metric values pertaining to said paths in a metric memory, and updating said metric values whenever said new path information is stored;

keeping a count of frames received;

waiting until said count reaches a value representing one block of frames;

selecting one path among said paths, according to said metric values;

generating one block of convolutionally decoded data by retracing said one path;

detecting errors according to both the redundant code contained in said one block and the metric value stored in said metric memory pertaining to said one path, and generating corresponding error information;

deciding, from said error information, whether block synchronization has been acquired;

altering said count to a value representing one frame less than one block of frames if block synchronization has not been acquired;

clearing said count to a value representing zero frames if block synchronization has been acquired;

deciding, from said error information, whether block synchronization has been lost;

clearing said count to a value representing zero frames if block synchronization has not been lost;

setting said count to a value representing at most zero frames if block synchronization has been lost; and outputting said one block and said error information.

2. The method of claim 1, wherein the step of deciding whether block synchronization has been acquired is performed once per frame until block synchronization is indeed acquired, after which the step of deciding whether block synchronization has been lost is performed once per block until block synchronization is indeed lost.

3. The method of claim 1, comprising the further step of clearing all said metric values from said metric memory after said step of deciding whether block synchronization has been lost.

4. The method of claim 1, wherein said count is initially set to a value representing a negative number of frames, so that said one block of convolutionally decoded data will not be generated until at least one frame after the data of said one block has been received.

5. The method of claim 1, wherein said step of detecting errors comprises:
deciding whether said one path matches the data received for said one block; and
deciding whether the redundant code in said one block is correct.

6. The method of claim 1, wherein the step of detecting whether block synchronization has been lost comprises deciding whether errors have been detected in a certain number of consecutive blocks.

7. The method of claim 1, wherein said error information comprises a single error flag.

8. The method of claim 7, wherein said error flag is cleared to a certain value when said one path matches the data received for said one block and the redundant code in said one block is correct, and said error flag is otherwise set to a different value.

9. The method of claim 1, wherein said path information comprises pointers.

10. A Viterbi decoder for decoding data that have been block encoded with a redundant code in each block, then convolutionally coded, transmitted, and received in frames at a rate of at least two frames per block, comprising:

an input buffer memory with a capacity of at least one frame, for storing said data as received;

a path memory for storing path information describing possible convolutional code paths for at least one block of said data;

a metric memory for storing metric values pertaining to said paths;

a path processor coupled to store new path information in said path memory and update said metric memory as each frame is received;

a counter coupled to count received frames;

a path decoder coupled to wait until said counter reaches a value representing one block of frames, then select one path among said paths according to said metric values and generate one block of convolutionally decoded data by retracing said one path;

an error detector coupled to detect errors according to the redundant code contained in said one block and the metric value stored in said metric memory pertaining to said one path, and generate error information;

a synchronizing processor coupled to decide from said error information whether block synchronization has been acquired, decrement said counter if block synchronization has not been acquired, and clear said counter to a value representing zero frames if block synchronization has been acquired;

a steady-state processor coupled to decide from said error information whether block synchronization has been lost, clear said counter to a value representing zero frames if block synchronization has not been lost, and set said counter to a value representing at most zero frames if block synchronization has been lost; and an output section coupled to output said one block and said error information.

11. The decoder of claim 10 wherein, after deciding whether block synchronization has been lost, said steady-state processor clears all said metric values from said metric memory.

12. The decoder of claim 10, wherein said counter is initially set to a value representing a negative number of frames, so that said path decoder will not generate said one block of convolutionally decoded data until at least one frame after the data of said one block has been received.

13. The decoder of claim 10, wherein said error detector detects an error unless the redundant code in said one block is correct and said one path matches the data received for said one block.

14. The decoder of claim 10, wherein said steady-state processor detects loss of block synchronization if said error detector detects that errors are present in a certain number of consecutive blocks.

15. The decoder of claim 10, wherein said error information comprises a single error flag.

16. The decoder of claim 10, wherein said path information comprises pointers.

* * * * *